United States Patent
Eum et al.

(10) Patent No.: US 10,714,606 B2
(45) Date of Patent: Jul. 14, 2020

(54) SEMICONDUCTOR DEVICE

(71) Applicant: DENSO CORPORATION, Kariya, Aichi-pref. (JP)

(72) Inventors: Youngshin Eum, Kariya (JP); Kazuhiro Oyama, Kariya (JP); Yasushi Higuchi, Kariya (JP); Yoshinori Tsuchiya, Kariya (JP); Shinichi Hoshi, Kariya (JP)

(73) Assignee: DENSO CORPORATION, Kariya (JP)

( * ) Notice: Subject to any disclaimer, the term of this patent is extended or adjusted under 35 U.S.C. 154(b) by 11 days.

(21) Appl. No.: 15/753,342

(22) PCT Filed: Sep. 5, 2016

(86) PCT No.: PCT/JP2016/075924
§ 371 (c)(1),
(2) Date: Feb. 19, 2018

(87) PCT Pub. No.: WO2017/051688
PCT Pub. Date: Mar. 30, 2017

(65) Prior Publication Data
US 2018/0248026 A1    Aug. 30, 2018

(30) Foreign Application Priority Data

Sep. 22, 2015 (JP) .................................. 2015-186166
Feb. 2, 2016 (JP) .................................. 2016-18265

(51) Int. Cl.
*H01L 29/778* (2006.01)
*H01L 29/06* (2006.01)
(Continued)

(52) U.S. Cl.
CPC ...... *H01L 29/7786* (2013.01); *H01L 29/0607* (2013.01); *H01L 29/205* (2013.01);
(Continued)

(58) Field of Classification Search
CPC ............. H01L 29/7786; H01L 29/7787; H01L 29/402; H01L 29/205; H01L 29/872;
(Continued)

(56) References Cited

U.S. PATENT DOCUMENTS

2006/0060895 A1    3/2006 Hikita et al.
2009/0045438 A1    2/2009 Inoue et al.
(Continued)

FOREIGN PATENT DOCUMENTS

JP    2002-359256 A    12/2002
JP    2013-062494 A    4/2013
(Continued)

OTHER PUBLICATIONS

Chen-hui Yu, Qing-zhou Luo, Xiang-dong Luo, and Pei-sheng Liu, "Donor-Like Surface Traps on Two-Dimensional Electron Gas and Current Collapse of AlGaN/GaN HEMTs", Aug. 12, 2013, Hindawi Publishing Corporation (the Scientific world Journal), vol. 2013, pp. 1-6 (Year: 2013).*

*Primary Examiner* — Cuong B Nguyen
(74) *Attorney, Agent, or Firm* — Posz Law Group, PLC

(57) ABSTRACT

A semiconductor device includes a conductive substrate, a channel forming layer, a first electrode, and a second electrode. The channel forming layer is located above the conductive substrate and includes at least one hetero-junction structure. The hetero-junction structure includes a first GaN-type semiconductor layer providing a drift region and a second GaN-type semiconductor layer having a bandgap energy greater than the first GaN-type semiconductor layer. A total fixed charge quantity of charges in the first GaN-type layer and the second GaN-type layer is from $0.5 \times 10^{13}$ to $1.5 \times 10^{13}$ cm$^{-2}$. The charges in the first GaN-type layer and the second GaN-type layer include charges generated by the polarization in the first GaN-type layer. Accordingly, the (Continued)

semiconductor device capable of improving a break-down voltage and decreasing an on-resistance is obtained.

13 Claims, 10 Drawing Sheets

(51) Int. Cl.

| | | |
|---|---|---|
| *H01L 29/812* | (2006.01) | |
| *H01L 29/205* | (2006.01) | |
| *H01L 29/872* | (2006.01) | |
| *H01L 29/40* | (2006.01) | |
| *H01L 29/20* | (2006.01) | |
| *H01L 29/10* | (2006.01) | |
| *H01L 29/423* | (2006.01) | |

(52) U.S. Cl.
CPC ........ *H01L 29/402* (2013.01); *H01L 29/7787* (2013.01); *H01L 29/812* (2013.01); *H01L 29/872* (2013.01); *H01L 29/1066* (2013.01); *H01L 29/2003* (2013.01); *H01L 29/4236* (2013.01)

(58) Field of Classification Search
CPC ............... H01L 29/812; H01L 29/0607; H01L 29/1066; H01L 29/4236; H01L 29/2003; H01L 29/66431; H01L 29/66462; H01L 29/778–7789; H01L 2924/13064; H01L 29/15–158; H01L 29/122–127

See application file for complete search history.

(56) References Cited

U.S. PATENT DOCUMENTS

| | | | |
|---|---|---|---|
| 2012/0217544 A1* | 8/2012 | Ohki | ..................... H01L 29/402 257/194 |
| 2012/0218783 A1* | 8/2012 | Imada | ................... H01L 29/402 363/17 |
| 2014/0021480 A1 | 1/2014 | Jeon | |
| 2014/0077311 A1* | 3/2014 | Simin | ................. H01L 29/7786 257/401 |

FOREIGN PATENT DOCUMENTS

| | | |
|---|---|---|
| JP | 2013-191637 A | 9/2013 |
| JP | 5344445 B2 | 11/2013 |
| JP | 2014-078537 A | 5/2014 |

\* cited by examiner

SEMICONDUCTOR DEVICE

CROSS REFERENCE TO RELATED APPLICATIONS

This application is a U.S. national phase of International Application No. PCT/JP2016/075924 filed on Sep. 5, 2016 and is based on Japanese Patent Application No. 2015-186166 filed on Sep. 22, 2015, and Japanese Patent Application No. 2016-18265 filed on Feb. 2, 2016, the disclosures of which are incorporated herein by reference.

TECHNICAL FIELD

The present disclosure relates to a semiconductor device having a hetero-junction structure on a conductive substrate, the hetero-junction structure including gallium nitride (hereinafter, GaN) and aluminum gallium nitride (hereinafter, AlGaN) stacked on the gallium nitride, that is, a first GaN-type semiconductor layer and a second GaN-type semiconductor layer.

BACKGROUND ART

Generally, in a horizontal device having the hetero-junction structure, there is a trade-off relationship between a breakdown voltage and an on-resistance. If one is improved, the other is likely to be sacrificed. In order to further improve characteristics of the semiconductor element, the trade-off relationship between the breakdown voltage and the on-resistance needs to be improved.

Patent literature 1 proposes an element structure capable of improving the trade-off relationship between the breakdown voltage and the on-resistance. Specifically, a voltage resistance, that is, the breakdown voltage is improved by a structure in which a semiconductor element such as a diode or a transistor includes the same quantity of 2-dimensional electric gas (hereinafter, 2DEG) and 2-dimensional hole gas (hereinafter, 2DHG).

PRIOR ART LITERATURE

Patent Literature

Patent literature 1: JP 5344445 B2

SUMMARY OF INVENTION

However, effects of the structure are limited to a structure including an insulating substrate and the breakdown voltage is not improved in the GaN device including the hetero-junction structure on a conductive substrate.

It is an object of the present disclosure to provide a semiconductor device including a GaN device on a conductive substrate and capable of improving a breakdown voltage and decreasing an on-resistance.

According to an aspect of the present disclosure, a semiconductor device includes a conductive substrate, a channel forming layer, a first electrode, and a second electrode. The channel forming layer is located above the conductive substrate and includes at least one hetero-junction structure. The hetero-junction structure includes a first GaN-type semiconductor layer providing a drift region and a second GaN-type semiconductor layer having a bandgap energy greater than the first GaN-type semiconductor layer. The first electrode and the second electrode are in contact with the second GaN-type semiconductor layer and located separately from each other. A distance between the first electrode and the second electrode is greater than a thickness of the hetero-junction structure including the first GaN-type semiconductor layer and the second GaN-type semiconductor layer.

The channel forming layer is configured to generate a current by a carrier of a 2-dimensional electron gas. The 2-dimensional electron gas is generated by a polarization in the first GaN-type semiconductor layer adjacent to an interface between the first GaN-type semiconductor layer and the second GaN-type semiconductor layer. A total fixed charge quantity of charges in the first GaN-type layer and the second GaN-type layer is from $0.5'10^{13}$ to $13\times10^{13}$ cm$^{-2}$. The charges in the first GaN-type layer and the second GaN-type layer include charges generated by the polarization in the first GaN-type layer.

According to the first aspect of the present disclosure, a break-down voltage, that is, a voltage resistance is improved in the semiconductor device including the GaN device on the conductive substrate. Additionally, low on-resistance is achieved by the 2DEG channel. Therefore, the semiconductor device capable of improving the break-down voltage and decreasing the on-resistance is obtained.

BRIEF DESCRIPTION OF DRAWINGS

The above and other objects, features and advantages of the present disclosure will become more apparent from the following detailed description made with reference to the accompanying drawings, in which.

DESCRIPTION OF EMBODIMENTS

Hereinafter, embodiments of the present disclosure will be described with reference to the drawings. In the following embodiments, the same or the equivalent parts will be designated by the same symbols.

Inventors of the present disclosure conducted a study with comparative examples and found that a high voltage is applied to a part of an electrode due to biased electrical potential distribution in a GaN device including a heterojunction structure on a conductive substrate. Specifically, the inventors conducted a simulation to form the GaN device on the conductive substrate, fix a negative electrode (e.g., a cathode electrode or a source electrode) to 0V, and apply 650V to a positive electrode (e.g., an anode electrode or a drain electrode).

Figure 20:
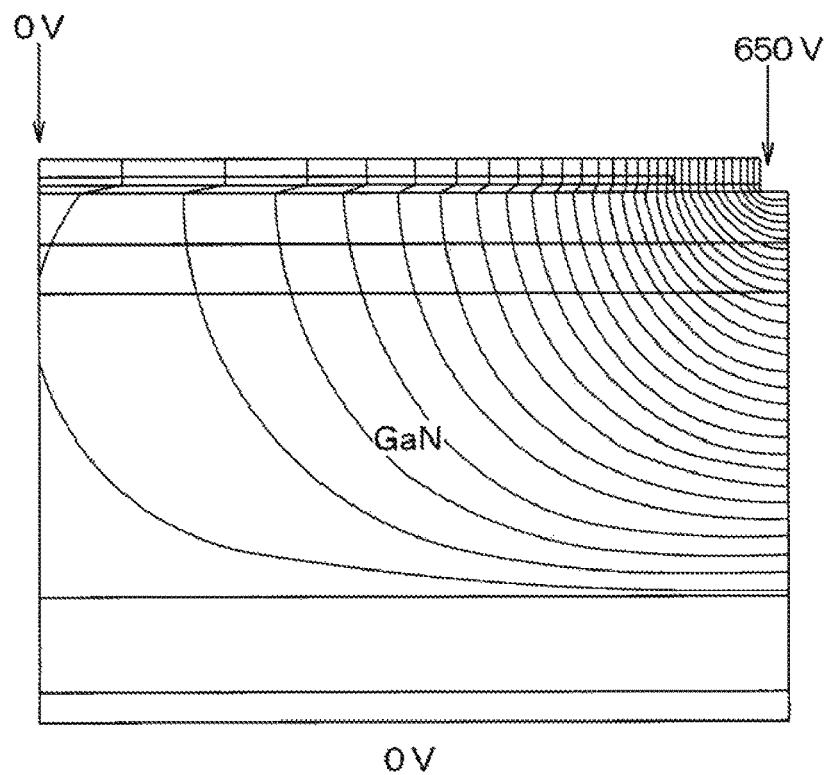
FIG. 20 is a diagram showing a simulation result of an electrical potential distribution when the GaN device is formed on a conductive substrate as a comparative example.

As a result, an electrical potential having a biased distribution is generated as shown in FIG. 20 and distances between equipotential lines are decreased around a positive electrode disposed at a right side of a sheet surface. That is, a high electrical field is applied to the positive electrode. In this case, concentration of the electrical field occurs at a neighborhood of the positive electrode and a voltage resistance is decreased.

Accordingly, when the GaN device is formed on the conductive substrate, the trade-off relationship between the breakdown voltage and the on-resistance is not improved even when the quantities of the 2DEG and the 2DHG are equalized. That is, a charge balance needs to be forcibly broken by differentiating the quantities of the 2DEG and the 2DHG, not by equalizing the quantities of the 2DEG and the 2DHG.

First Embodiment

Figure 1:
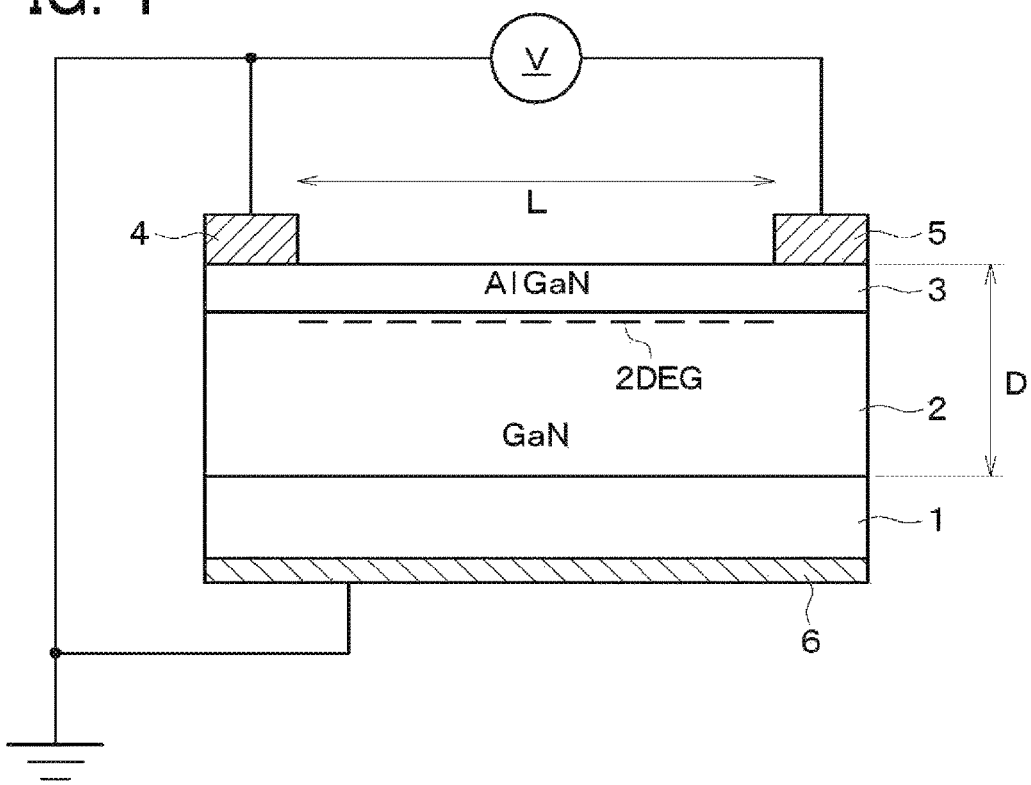
FIG. 1 is a cross-sectional view of a semiconductor device according to a first embodiment of the present disclosure.

A semiconductor device of the present embodiment will be described with reference to FIG. 1. As shown in FIG. 1, the semiconductor device of the present embodiment includes a GaN horizontal device.

The horizontal device of the present embodiment includes a compound semiconductor substrate provided by i, n or, p-type GaN layer 2 on a surface of a conductive substrate 1. On a surface of the GaN layer 2, an AlGaN layer 3 is formed and the GaN layer 2 and the AlGaN layer 3 provide a hetero-junction structure.

In the horizontal device, the GaN layer 2 and the AlGaN layer 3 function as a channel forming layer. A 2DEG carrier is induced in the GaN layer 2 adjacent to an AlGaN/GaN interface by piezoelectric effect and self-polarization effect. The horizontal device operates by the region functioning as a channel where the carrier flows.

The substrate 1 is formed of a conductive material such as a semiconductor material of Si (111) or SiC. The GaN layer 2 may be directly formed on the substrate 1, or a buffer layer as a base coat may be formed, as necessary, on the substrate 1 in order to improve a crystallinity of the GaN layer 2. When the GaN layer 2 is formed on the substrate 1 with high crystallinity, the buffer layer may be omitted. The crystallinity of the present embodiment means a defect or a dislocation in the GaN layer 2 affecting electrical and optical characteristics.

Above the substrate 1, the GaN layer 2 and the AlGaN layer 3 are formed by hetero-epitaxial growth.

The GaN layer 2 corresponds to a first GaN-type semiconductor layer and is formed of a GaN-type semiconductor material of i-GaN, n-GaN, or p-GaN. The horizontal device operates with the GaN layer 2 functioning as the drift region. For example, a horizontal high electron mobility transistor (HEMT), which is a switching device, corresponds to the horizontal device. In this case, the GaN layer 2 provides an electron transit layer.

The AlGaN layer 3 corresponds to a second GaN-type semiconductor layer and is formed of a GaN-type semiconductor material having a bandgap energy greater than the GaN-type semiconductor material of the GaN layer 2. The AlGaN layer 3 provides an electron donor portion.

The AlGaN layer 3 is formed of $Al_xGa_{1-x}N$ in which x represents an Al mixed crystal ratio. The Al mixed crystal ratio x and a thickness of the AlGaN layer 3 determine a concentration of the 2DEG generated in a near-surface region of the GaN layer 2 adjacent to the surface of the GaN layer 2. Therefore, the concentration of the 2DEG is adjusted by adjusting the Al mixed crystal ratio x and the thickness of the AlGaN layer 3 so that a total fixed charge quantity of the charges, which includes charges generated by the polarization, is in a range from $0.5 \times 10^{13}$ to $1.5 \times 10^{13}$ $cm^{-2}$. The total fixed charge quantity of the charges corresponds to the sum of charges of the polarization of the GaN layer 2, which provides the drift region, and the other charges.

The thickness of the AlGaN layer 3 and the concentration of the 2DEG have been known to have a specific relationship. When the AlGaN layer 3 is thin, the concentration of the 2DEG varies largely. When the AlGaN layer 3 has a certain thickness, the concentration of the 2DEG does not depend on the thickness of the AlGaN layer 3 and is unambiguously determined by the Al mixed crystal ratio x. Accordingly, the concentration of the 2DEG is adjusted based on the Al mixed crystal ratio x and the thickness of the AlGaN layer 3. The total fixed charge quantity is adjusted to be in a range from $0.5 \times 10^{13}$ to $1.5 \times 10^{13}$ $cm^{-2}$ based on the adjustment of the concentration of the 2DEG.

The total fixed charge quantity of the present embodiment is a total number of charges included in the GaN layer 2 and the AlGaN layer 3. More specifically, the total fixed charge quantity of the present embodiment is a total number of charges included in an entire region of the GaN layer 2 and a region of the AlGaN layer 3 adjacent to the GaN layer 2 in which the charges concentrate. In other words, the total fixed charge quantity of the present embodiment is a total number of charges included in the channel forming layer, and a total number of charges included in a region above an interface of the substrate 1 and the GaN layer 2, that is, a region opposite to the substrate 1.

If the GaN layer 2 is formed on the substrate 1 through the buffer layer, the total fixed charge quantity is a total number of charges included in a region above an interface of the buffer layer and the GaN layer 2. The total fixed charge quantity of the present embodiment is a total number of charges adding plus and minus of charges. Therefore, when the plus charges and the minus charges are added, the total fixed charge quantity is a value obtained by the plus charges and the minus charges cancelled with each other. The total fixed charge quantity is not a value obtained by adding absolute values of the plus charges and the minus charges.

On a surface of the AlGaN layer 3, a first electrode 4 and a second electrode 5 are formed separately from each other. A distance L between the first electrode 4 and the second electrode 5 is greater than a thickness D of the heterojunction structure of the GaN layer 2 and the AlGaN layer 3. The first electrode 4 and the second electrode 5 are in ohmic-contact with the AlGaN layer 3. On a rear surface of 1, that is, on a surface of the substrate 1 opposite to the GaN layer 2, a rear electrode 6 is formed. Accordingly, the horizontal device of the present embodiment is provided.

Although not illustrated, on a surface of each of the first electrode 4 and the second electrode 5, an electrical wiring layer formed of Al or the like is formed. As shown in FIG. 1, a voltage source V is connected to the first electrode 4 and the second electrode 5 through the electrical wiring layer to generate a potential difference between the first electrode 4 and the second electrode 5. For example, the first electrode 4 and the rear electrode 6 have a ground potential.

In the semiconductor device of the present embodiment, the total fixed charge quantity in the near-surface region of the GaN layer 2, which provides the drift region, is in a range from $0.5 \times 10^{13}$ to $1.5 \times 10^{13}$ cm$^{-2}$. According to the above structure, even when the substrate 1 is the conductive substrate, the concentration of the electrical field around the second electrode 5, which is caused by, for example, a high electrical field applied to the second electrode 5 in turning-off of the semiconductor device, is restricted. This effect will be described with reference to FIGS. 2 to 4.

Figure 2:
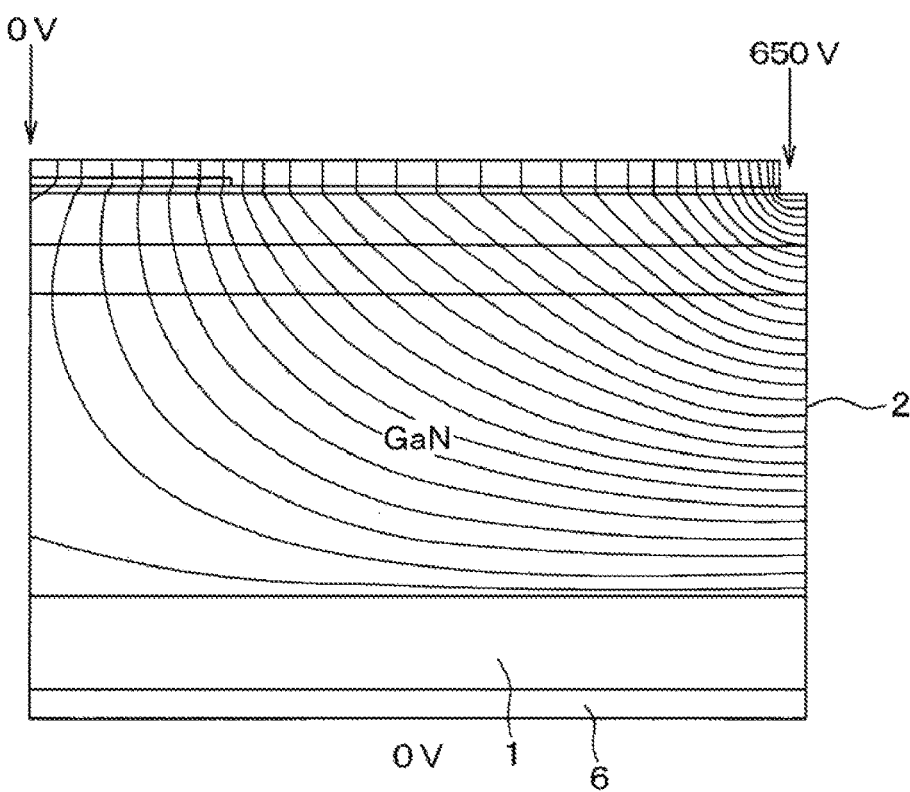
FIG. 2 is a diagram showing a simulation result when a total fixed charge quantity in a near-surface region of a GaN layer is less than $0.5\times10^{13}$ cm$^{-2}$.
Figure 3:
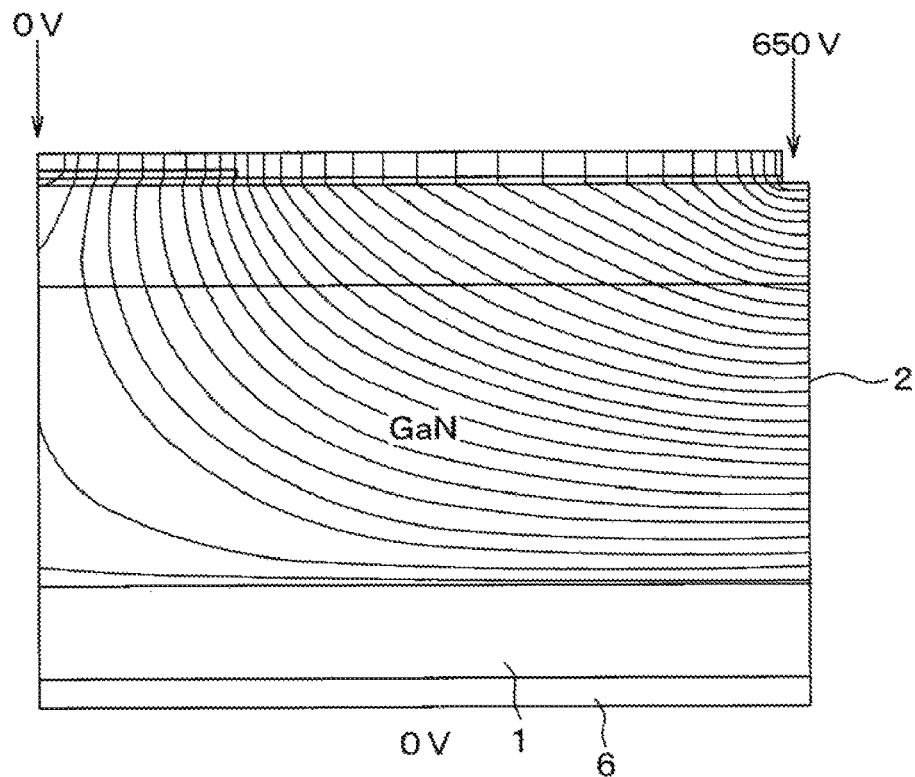
FIG. 3 is a diagram showing a simulation result when the total fixed charge quantity in a near-surface region of the GaN layer is from $0.5\times10^{13}$ to $1.5\times10^{13}$ cm$^{-2}$.
Figure 4:
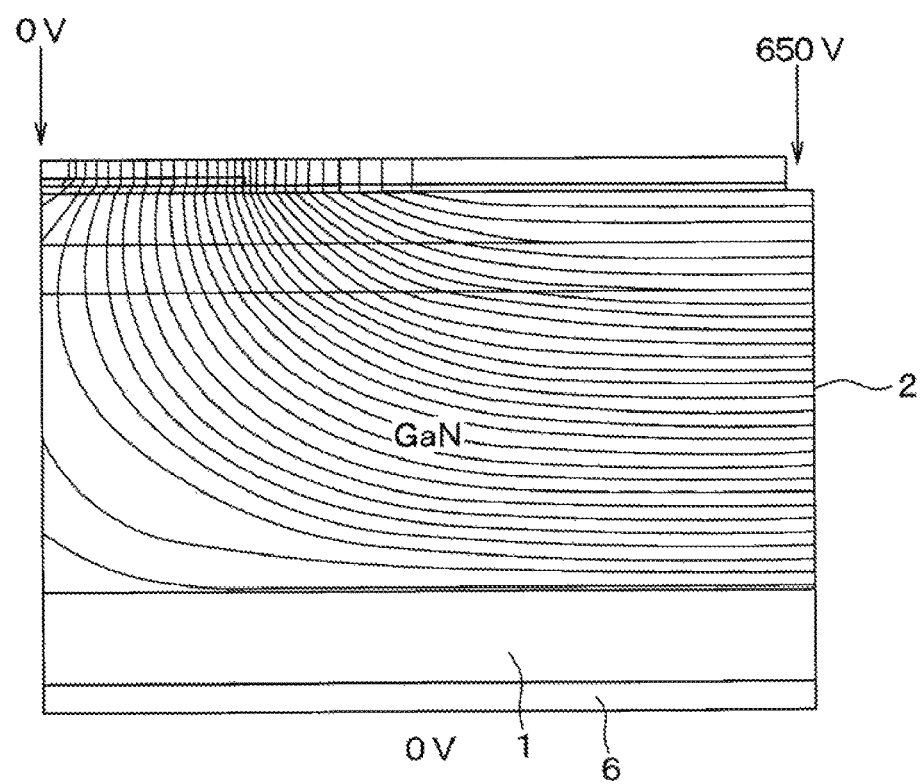
FIG. 4 is a diagram showing a simulation result when the total fixed charge quantity in a near-surface region of the GaN layer is greater than $1.5\times10^{13}$ cm$^{-2}$.

Simulations are conducted with respect to a case where the total fixed charge quantity in the near-surface region of the GaN layer 2 is less than $0.5 \times 10^{13}$ cm$^{-2}$, a case where the total fixed charge quantity in the near-surface region of the GaN layer 2 is in the range from $0.5 \times 10^{13}$ to $13 \times 10^{13}$ cm$^{-2}$, and a case where the total fixed charge quantity in the near-surface region of the GaN layer 2 is greater than $1.5 \times 10^{13}$ cm$^{-2}$. Specifically, the first electrode 4 as the negative electrode (in the present embodiment, a left side of the sheet surface) is fixed at 0V and the second electrode 5 as the positive electrode (in the present embodiment, a right side of the sheet surface) is applied with 650V, and then the electrical potential distributions are observed by the simulations. The results are shown in FIGS. 2 to 4. Although examples in which the second electrode 5 is applied with the 650V are described in the present embodiment, similar results are confirmed to be obtained with other voltages.

As shown in FIG. 2, when the total fixed charge quantity in the near-surface region of the GaN layer 2 is less than $0.5 \times 10^{13}$ cm$^{-2}$, the distances between the equipotential lines are decreased around the second electrode 5. In this case, the concentration of the electrical field occurs around the second electrode 5, and thereby to decrease the voltage resistance.

On the other hand, as shown in FIG. 3, when the total fixed charge quantity in the near-surface region of the GaN layer 2 is in the range from $0.5 \times 10^{13}$ to $1.5 \times 10^{13}$ cm$^{-2}$, the distances between the equipotential lines are almost the same from the first electrode 4 to the second electrode 5. This result has been newly found by the inventors of the present embodiment and has not been conventionally known. In this case, the concentration of the electrical field does not occur and the voltage resistance is determined by the thickness of the GaN layer 2.

As shown in FIG. 4, when the total fixed charge quantity of the near-surface region of the GaN layer 2 is greater than $1.5 \times 10^{13}$ cm$^{-2}$, the distances between the equipotential lines are decreased around the first electrode 4. In this case, the concentration of the electrical field occurs around the first electrode 4, and thereby to decrease the voltage resistance.

Accordingly, the total fixed charge quantity in the near-surface region of the GaN layer 2 and the voltage resistance have a relationship in which, for example, the voltage resistance is decreased when the total fixed charge quantity in the near-surface region of the GaN layer 2 is less than $0.5 \times 10^{13}$ cm$^{-2}$ or greater than $1.5 \times 10^{13}$ cm$^{-2}$. Also, a high voltage resistance is obtained when the total fixed charge quantity in the near-surface region of the GaN layer 2 is in the range from $0.5 \times 10^{13}$ to $1.5 \times 10^{13}$ cm$^{-2}$.

As described above, when the total fixed charge quantity in the near-surface region of the GaN layer 2 is in the range from $0.5 \times 10^{13}$ to $1.5 \times 10^{13}$ cm$^{-2}$, the breakdown voltage, that is, the voltage resistance is improved in the semiconductor device including the GaN device above the conductive substrate 1. Thus, low on-resistance is achieved with the 2DEG channel and the semiconductor device capable of improving the break down voltage and decreasing the on-resistance is obtained.

Second Embodiment

A second embodiment of the present disclosure will be described. In the present embodiment, a structure adjusting the total fixed charge quantity is changed from the first embodiment. Since the other parts are similar to the first embodiment, different parts will be described.

Figure 5:
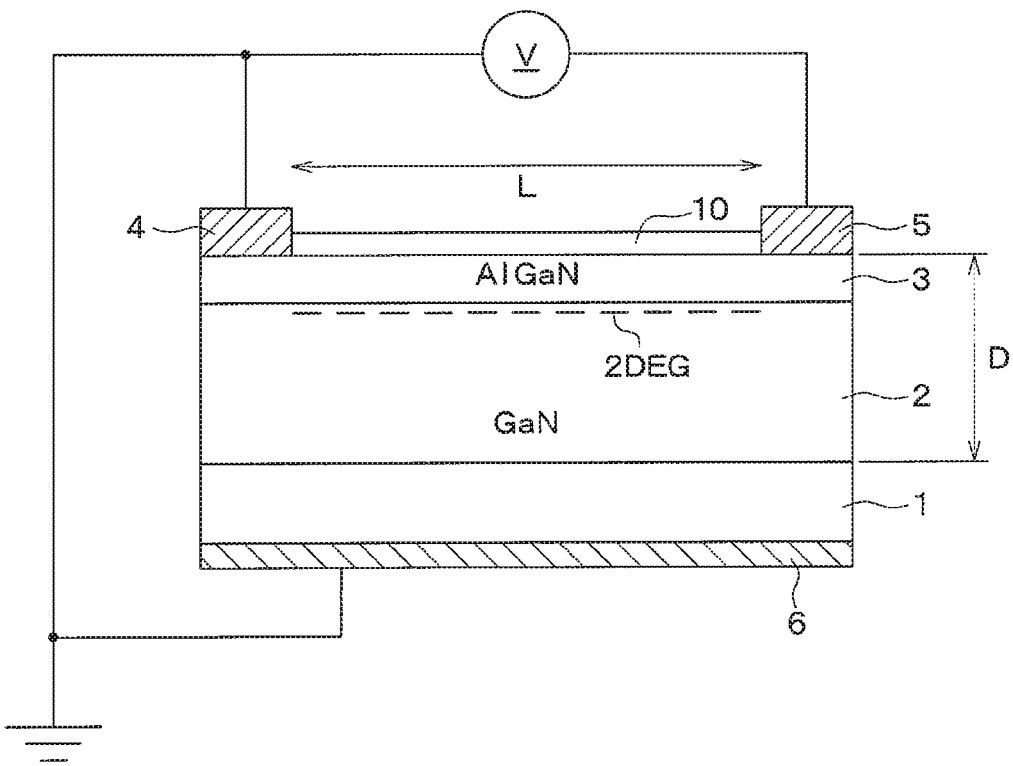
FIG. 5 is a cross-sectional view of a semiconductor device according to a second embodiment of the present disclosure.

As shown in FIG. 5, the semiconductor device of the present embodiment includes a charge adjusting layer 10 on the AlGaN layer 3. The first electrode 4 is a Schottky electrode and the second electrode 5 is an Ohmic electrode.

For example, the charge adjusting layer 10 is formed of an n-type AlGaN layer or an n-type GaN layer. The charge adjusting layer 10 generates fixed charges by n-doping. The charge adjusting layer 10 formed of the n-type AlGaN increases plus charges. When the thickness of the AlGaN layer 3 is equal to or greater than the predetermined thickness, the concentration of the 2DEG is almost constant. Therefore, there is a limitation in adjusting the total fixed charge quantity only by the 2DEG concentration. When the charge adjusting layer 10 is stacked on the AlGaN layer 3 to further increase the total fixed charge quantity, the total fixed charge quantity is more accurately adjusted in the range from $0.5 \times 10^{13}$ to $1.5 \times 10^{13}$ cm$^{-2}$.

Figure 6:
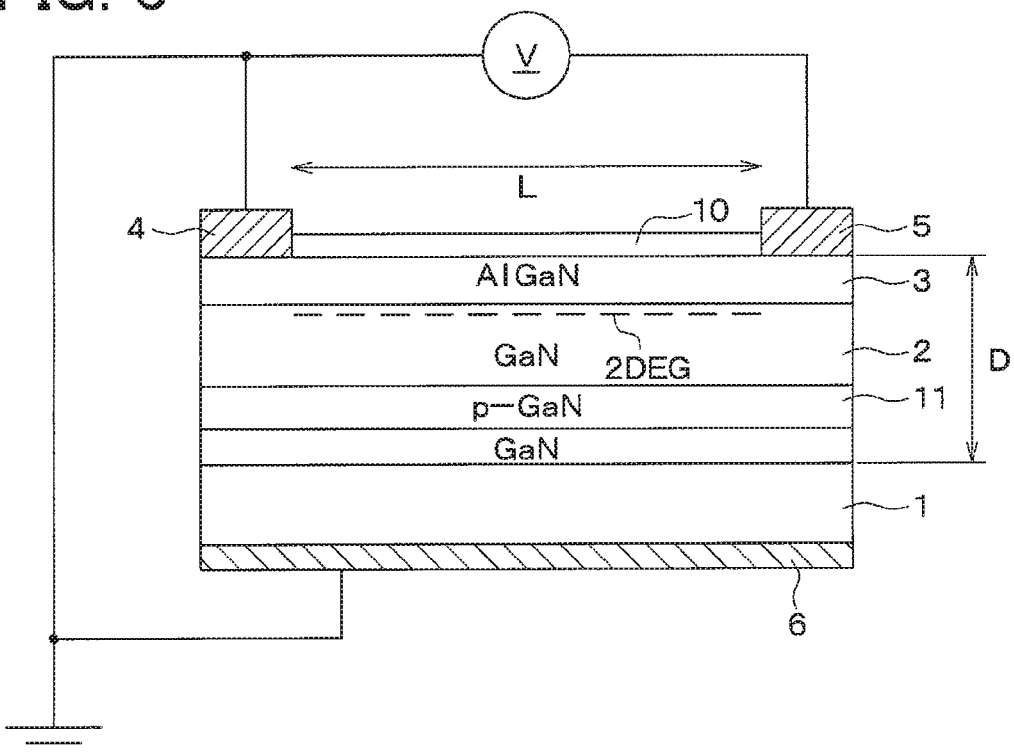
FIG. 6 is a cross-sectional view of a semiconductor device according to a modification of the second embodiment.

Especially, as shown in FIG. 6, a p-type GaN layer 11 may be formed inside of the GaN layer 2 in a thickness direction of the GaN layer 2 for improving leak characteristics, controlling a threshold of FET, and the like. In this structure, the p-type GaN layer 11 increases minus charges and the total fixed charge quantity is likely to be lower than the range from $0.5 \times 10^{13}$ to $1.5 \times 10^{13}$ cm$^{-2}$.

When the charge adjusting layer 10 is formed, the total fixed charge quantity is adjusted in a range in which the total fixed charge quantity cannot be adjusted only by the concentration of the 2DEG. Accordingly, the total fixed charge quantity is adjusted in the range from $0.5 \times 10^{13}$ to $1.5 \times 10^{13}$ cm$^{-2}$.

Figure 7:
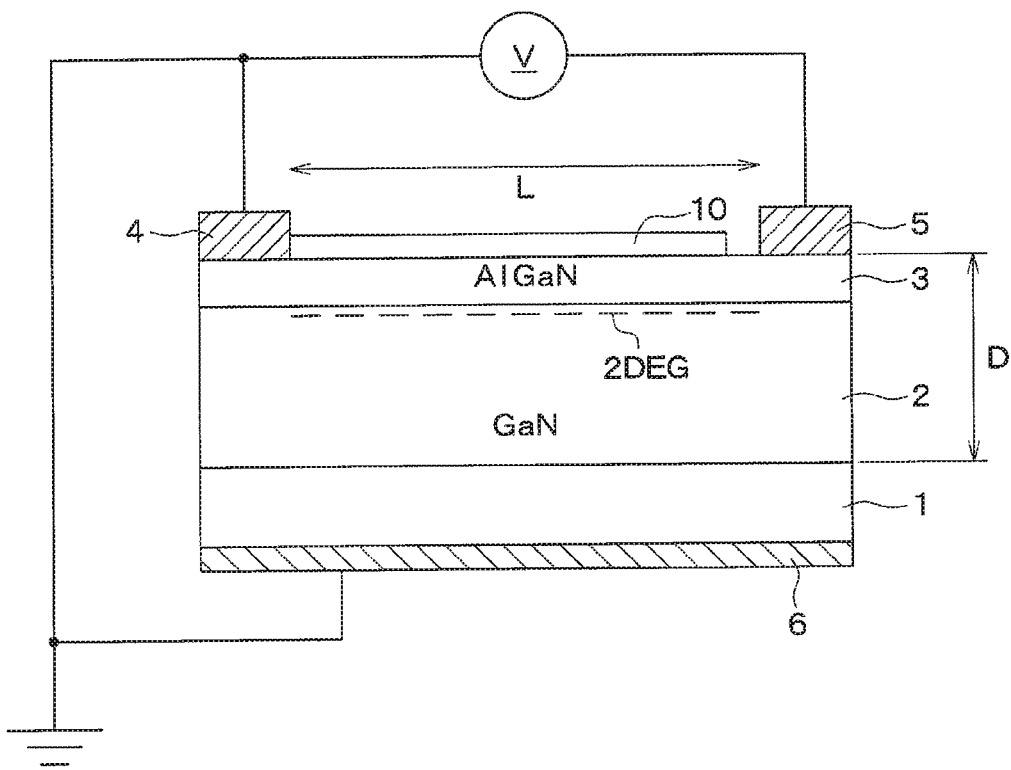
FIG. 7 is a cross-sectional view of a semiconductor device according to a modification of the second embodiment.
Figure 8:
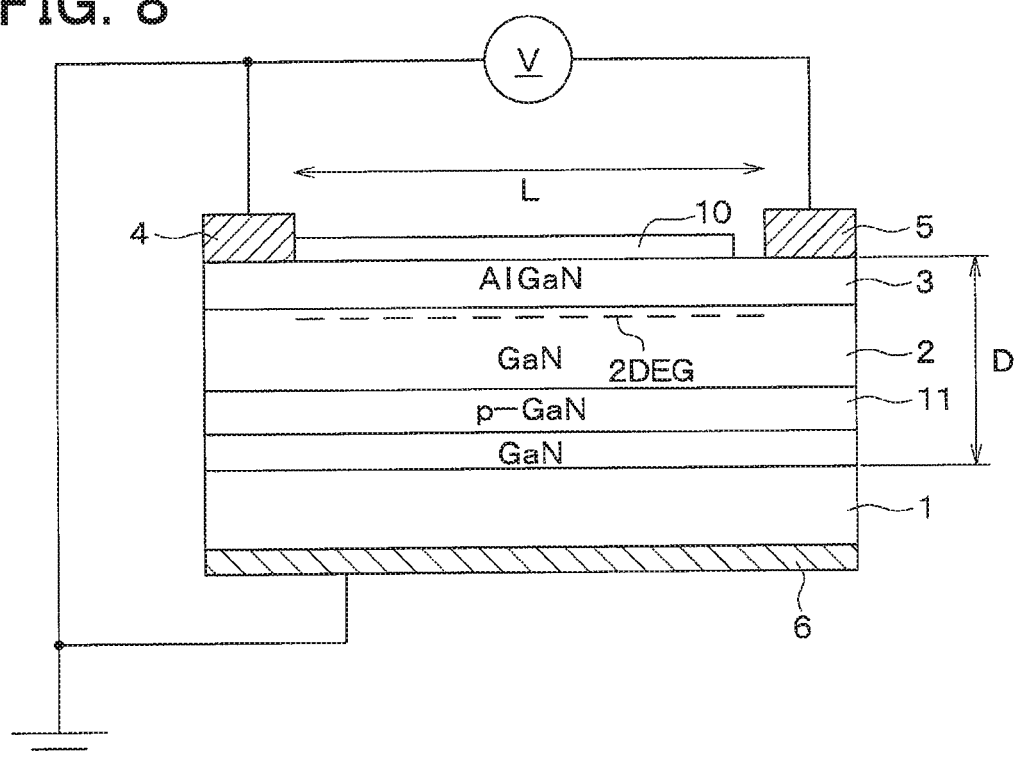
FIG. 8 is a cross-sectional view of a semiconductor device according to a modification of the second embodiment.

In the present embodiment, the first electrode 4 and the second electrode 5 are in contact with the charge adjusting layer 10. However, as shown in FIG. 7 and FIG. 8, the second electrode 5 may be separated from the charge adjusting layer 10 because there is a possibility of an energization through the charge adjusting layer 10. In this structure, the energization between the first electrode 4 and the second electrode 5 through the charge adjusting layer 10 is restricted.

Third Embodiment

A third embodiment of the present disclosure will be described. The present embodiment shows an example of a GaN device including the structure described in the first embodiment.

Figure 9:
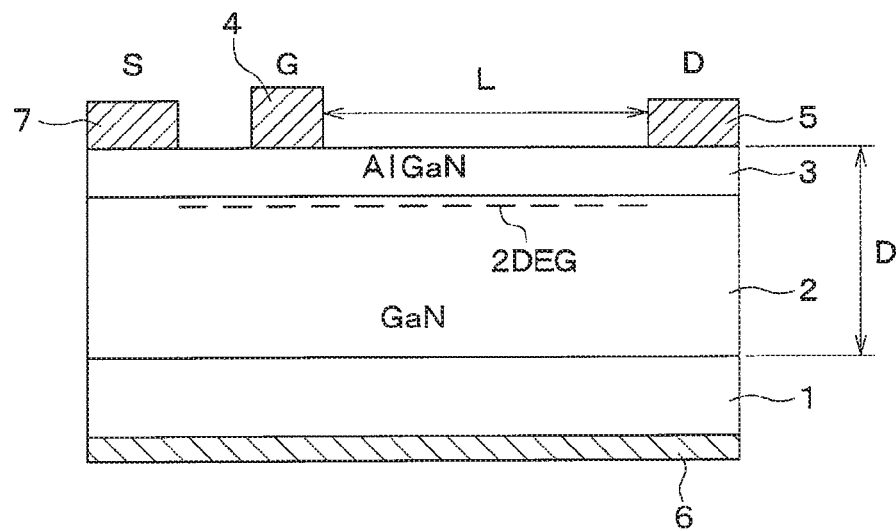
FIG. 9 is a cross-sectional view of a semiconductor device according to a third embodiment of the present disclosure.

As shown in FIG. 9, in the present embodiment, a semiconductor device includes a horizontal HEMT having a three-terminal structure. The horizontal HEMT includes the first electrode 4 as a gate electrode and the second electrode 5 as a drain electrode. The horizontal HEMT includes a third electrode 7 providing a source electrode. The third electrode 7 is located opposite to the second electrode 5 with respect to the first electrode 4, and the first electrode 4 is located between the second electrode 5 and the third electrode 7. A distance L between the first electrode 4 and the second electrode 5 is greater than a thickness D of the GaN layer 2 and the AlGaN layer 3.

In FIG. 9, the first electrode 4, which provides the gate electrode, is included in a gate electrode structure provided by a Schottky electrode structure in which the first electrode 4 includes a Schottky electrode that is in contact with the surface of the AlGaN layer 3. However, the gate electrode structure may be provided by other structures.

Figure 10:
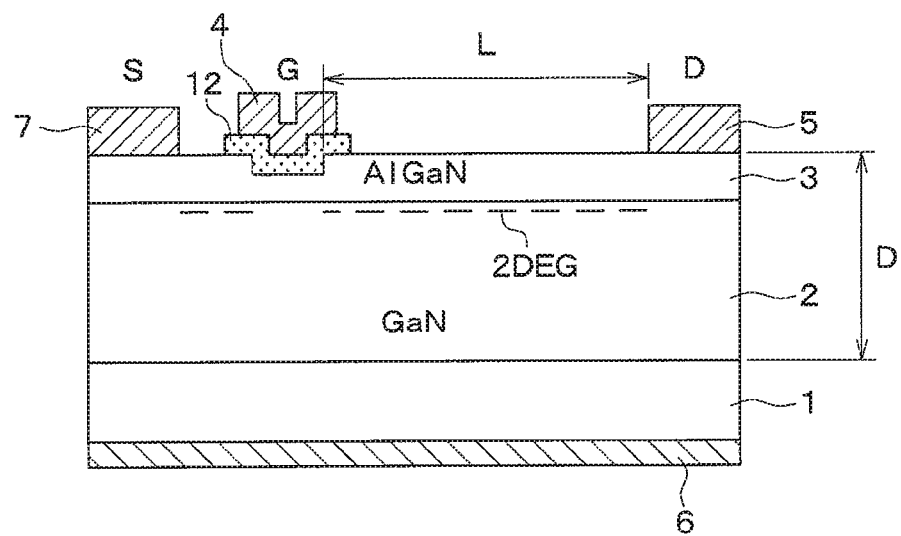
FIG. 10 is a cross-sectional view of a semiconductor device according to a modification of the third embodiment.

For example, as shown in FIG. 10, the gate electrode structure may be provided by a MOS structure in which the first electrode 4 is formed on the AlGaN layer 3 through a gate insulation film 12. In this case, as shown in FIG. 10, the surface of the AlGaN layer 3 may be partially recesses to form a recess at the position where the first electrode 4 is to be formed. In addition to the recess in which the AlGaN layer 3 is partially recessed, the AlGaN layer 3 may be entirely recessed in the thickness direction of the AlGaN layer 3, or the entire 3 and the GaN layer 2 may be recessed. When the recess is formed, the distance L corresponds to a distance from an end of the recess facing the second electrode 5 to the second electrode 5.

Figure 11:
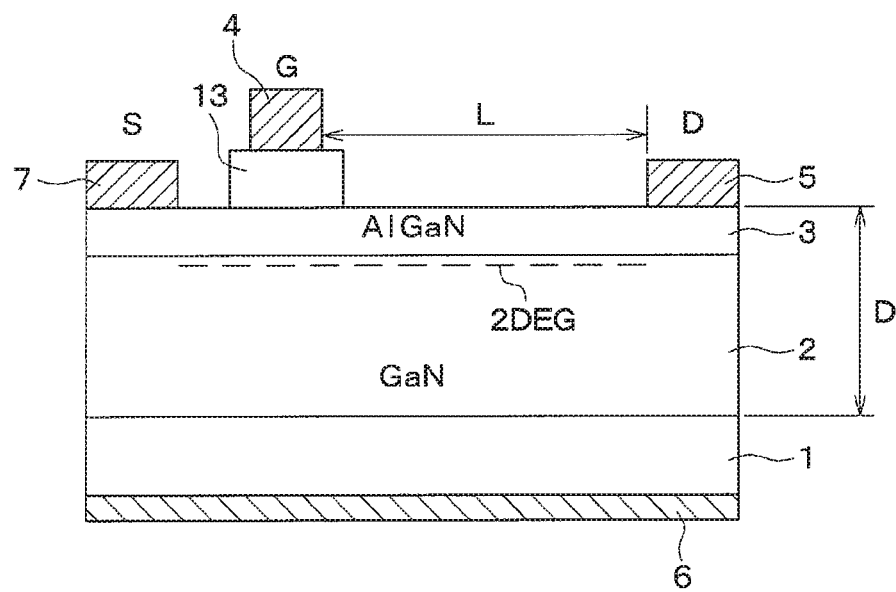
FIG. 11 is a cross-sectional view of a semiconductor device according to a modification of the third embodiment.

For example, as shown in FIG. 11, the gate electrode structure may be provided by a structure in which the first electrode 4 is disposed on a gate GaN layer 13 that is formed of a GaN-type semiconductor layer such as p-type GaN layer or p-type AlGaN layer. In this structure, the distance L corresponds to a distance from an end of the gate GaN layer 13 facing the second electrode 5 to the second electrode 5.

In the drift region between the gate and the drain of the horizontal HEMT, the total fixed charge quantity is adjusted in the range from $0.5 \times 10^{13}$ to $1.5 \times 10^{13}$ cm$^{-2}$. As such, the electrical field distribution is balanced between the gate and the drain. Accordingly, the effects described in the first embodiment are achieved.

Figure 12:
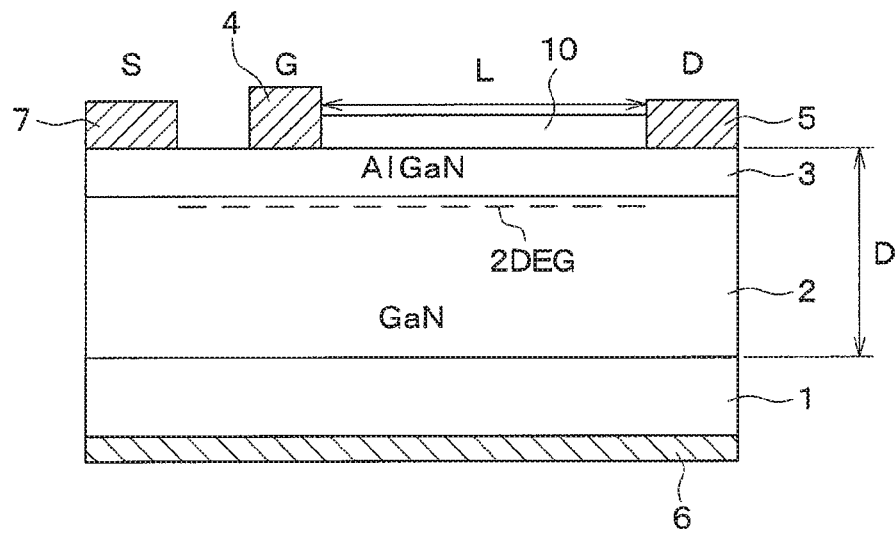
FIG. 12 is a cross-sectional view of a semiconductor device according to a modification of the third embodiment.

Also in the semiconductor device including the HEMT having the three-terminal structure as described in the present embodiment, as shown in FIG. 12, the charge adjusting layer 10 may be formed between the first electrode 4 and the second electrode 5.

Figure 13:
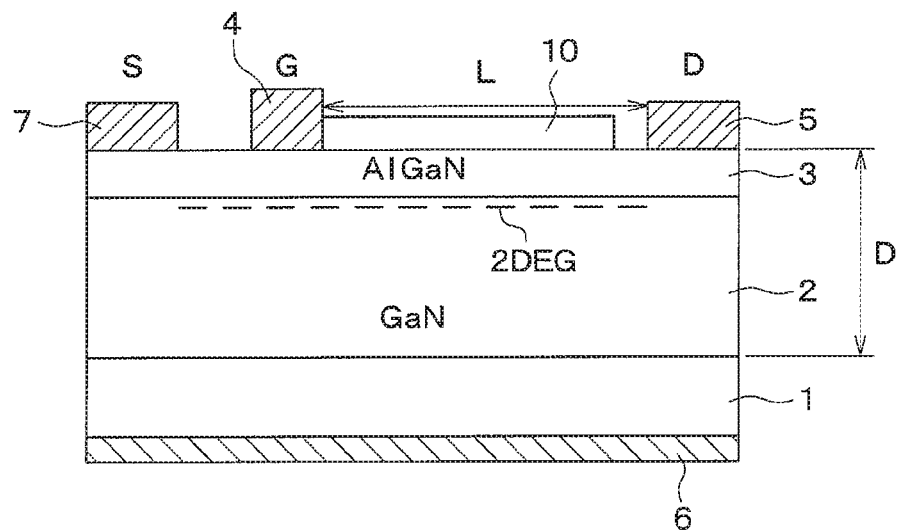
FIG. 13 is a cross-sectional view of a semiconductor device according to a modification of the third embodiment.

Also in this structure, the first electrode 4 and the second electrode 5 may be in contact with the charge adjusting layer 10. As shown in FIG. 13, the second electrode 5 may be separated from the charge adjusting layer 10 because there is a possibility that the energization occurs through the charge adjusting layer 10. In this structure, the energization between the first electrode 4 and the second electrode 5 through the charge adjusting layer 10 is restricted.

Fourth Embodiment

The fourth embodiment of the present disclosure will be described. In the present embodiment, an electrode corresponding to a fourth terminal is added to the third embodiment. Since the other parts are similar to the third embodiment, parts different from the third embodiment will be described.

Figure 14:
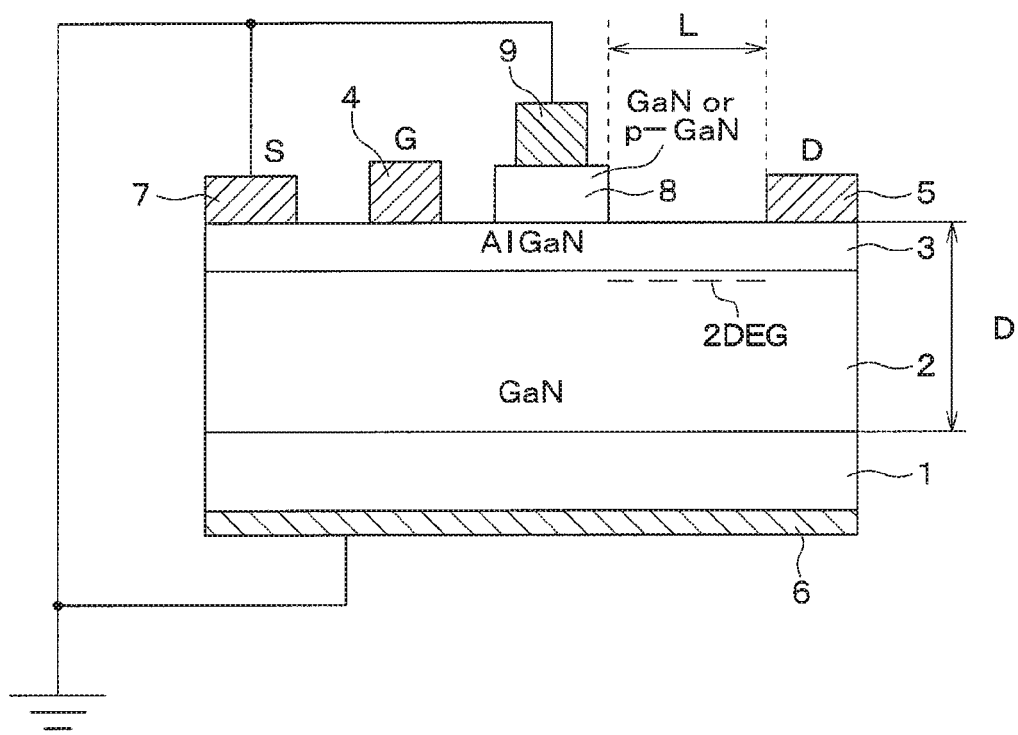
FIG. 14 is a cross-sectional view of a semiconductor device according to a fourth embodiment of the present disclosure.

As shown in FIG. 14, in the present embodiment, an electrical field easing layer 8 is provided on the surface of the AlGaN layer 3 between the first electrode 4 providing the gate electrode and the second electrode 5 providing the drain electrode. The electrical field easing layer 8 is formed of an i-type GaN layer or a p-type GaN layer. On the surface of the electrical field easing layer 8, a fourth electrode 9 is formed. The fourth electrode 9 has an electrical potential equivalent to the third electrode 7. Since the third electrode 7 and the fourth electrode 9 have the equivalent electrical potential, the electrical field easing layer 8 has the source potential. The fourth electrode 9 provides a horizontal HEMT having a four-terminal structure. The distance L between the fourth electrode 9 and the second electrode 5 is greater than the thickness D of the GaN layer 2 and the AlGaN layer 3.

The electrical field intensity of the drift region is acceptable up to 3.3 MV/cm, which is a break-down electrical field of the GaN. However, if a strong electrical field is applied to the first electrode 4 providing the gate electrode, there is a possibility that collapse or variation of threshold occurs.

In the present embodiment, the electrical field easing layer 8 is provided between the first electrode 4 and the second electrode 5, and the electrical field easing layer 8 has the source electrical potential. Even when the high electrical potential is applied to the second electrode 5 in the turning-off, the high electrical potential is applied to the fourth terminal. That is, the high electrical potential is restricted from being applied to the first electrode 4, which provides the gate electrode, and the gate can be protected from the high electrical potential. Accordingly, the semiconductor device having excellent voltage resistance and improved endurance is obtained.

Figure 15:
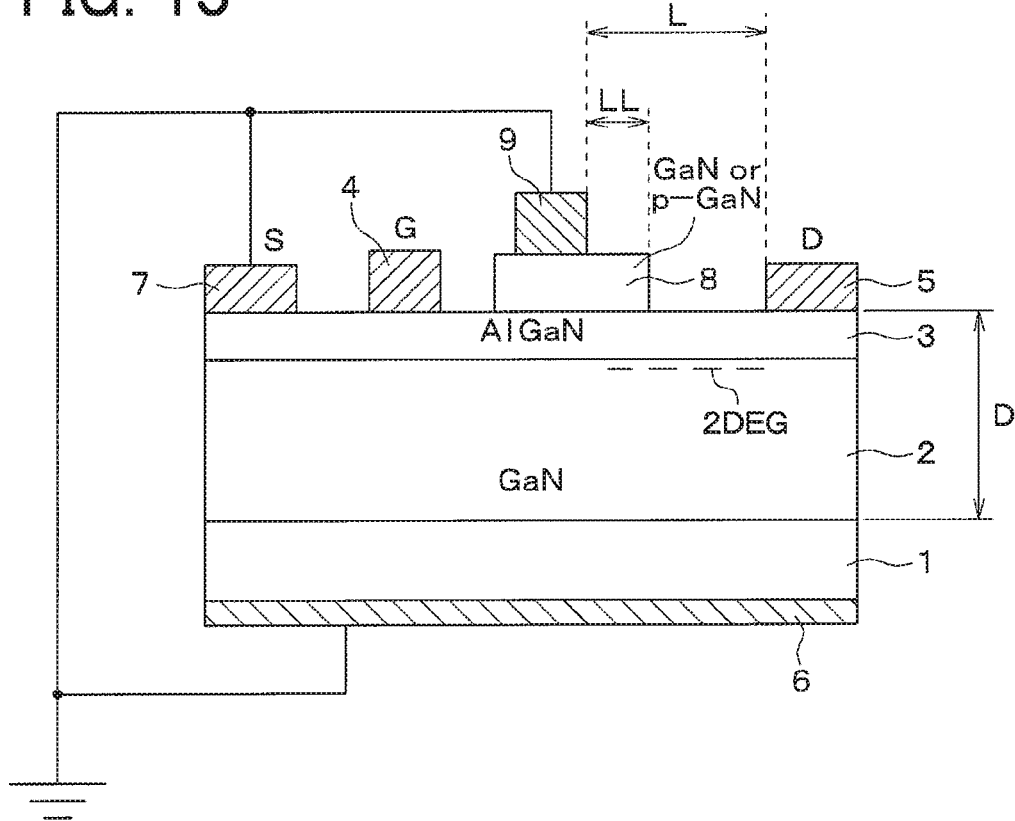
FIG. 15 is a cross-sectional view of a semiconductor device according to a modification of the fourth embodiment.

In the above structure, the high electrical potential is likely to be applied to an edge of the fourth electrode 9, which provides the fourth terminal, that is, an end of the fourth electrode 9 closest to the second electrode 5. Therefore, as shown in FIG. 15, the electrical field easing layer 8 below the fourth electrode 9 is preferable to have a protruding portion protruding toward the second electrode 5. As such, the concentration of the electrical field is eased from the end of the electrical field easing layer 8 adjacent to the second electrode 5 through the edge of the fourth electrode 9.

However, the interface between the electrical field easing layer 8 and the AlGaN layer 3 has the 2DHG, and the fixed charge quantity in the interface between the electrical field easing layer 8 and the AlGaN layer 3 is equal to 0. When a length LL of the protruding portion of the electrical field easing layer 8 protruding toward the second electrode 5 is greater, the concentration of the electrical field to the second electrode 5 occurs. Therefore, the length LL is preferable to be equal to or less than a half of the distance L between the fourth electrode 9 and the second electrode 5, in order to restrict the concentration of the electrical field to the second electrode 5.

Figure 16:
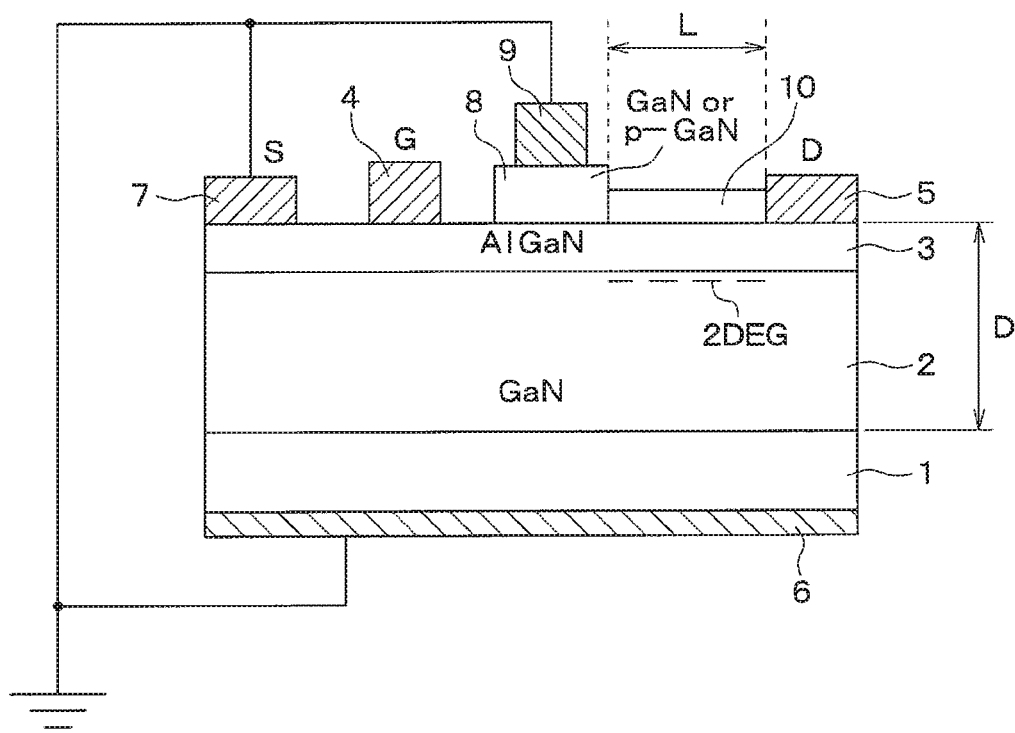
FIG. 16 is a cross-sectional view of a semiconductor device according to a modification of the fourth embodiment.

Also in the semiconductor device including the horizontal HEMT having the four-terminal structure, as shown in FIG. 16, the charge adjusting layer 10 may be provided between the fourth electrode 9 and the second electrode 5.

Figure 17:
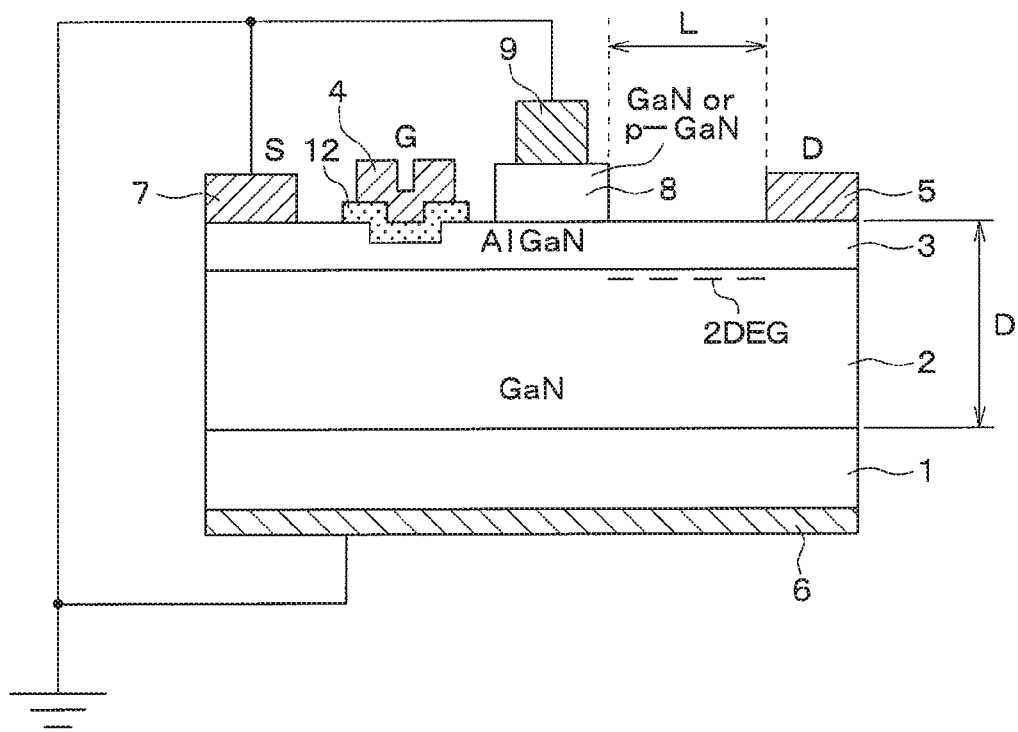
FIG. 17 is a cross-sectional view of a semiconductor device according to a modification of the fourth embodiment.

Although in FIG. 14, the first electrode 4, which provides the gate electrode, is included in the gate electrode structure in which the first electrode 4 includes the Schottky electrode that is in contact with the surface of the AlGaN layer 3, the gate electrode structure may be provided by other structures. For example, as shown in FIG. 17, the gate electrode may be provided by the MOS structure in which the first electrode 4 is disposed on the AlGaN layer 3 through the gate insulation film 12. In this case, as shown in FIG. 17, the surface of the AlGaN layer 3 may be partially recessed to provide a recess at a position where the first electrode 4 is formed.

Figure 18:
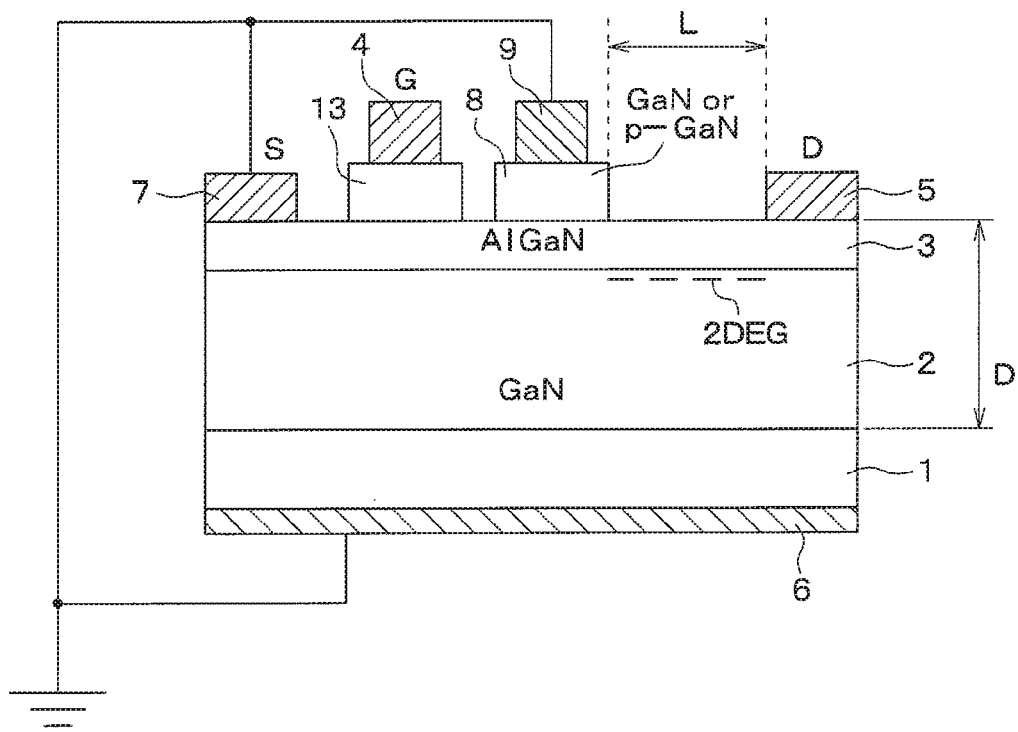
FIG. 18 is a cross-sectional view of a semiconductor device according to a modification of the fourth embodiment.

As shown in FIG. 18, the first electrode 4, which provides the gate electrode, may be disposed on the gate GaN layer 13 that is formed of the GaN-type semiconductor layer such as the p-type GaN layer or the p-type AlGaN layer.

Fifth Embodiment

A fifth embodiment of the present disclosure will be described. In the present embodiment, the electrode providing the fourth terminal is added similarly to the fourth embodiment, but a structure of the electrode of the fourth terminal is different from the fourth embodiment. Since the other parts are similar to the fourth embodiment, parts different from the fourth embodiment will be described.

Figure 19:
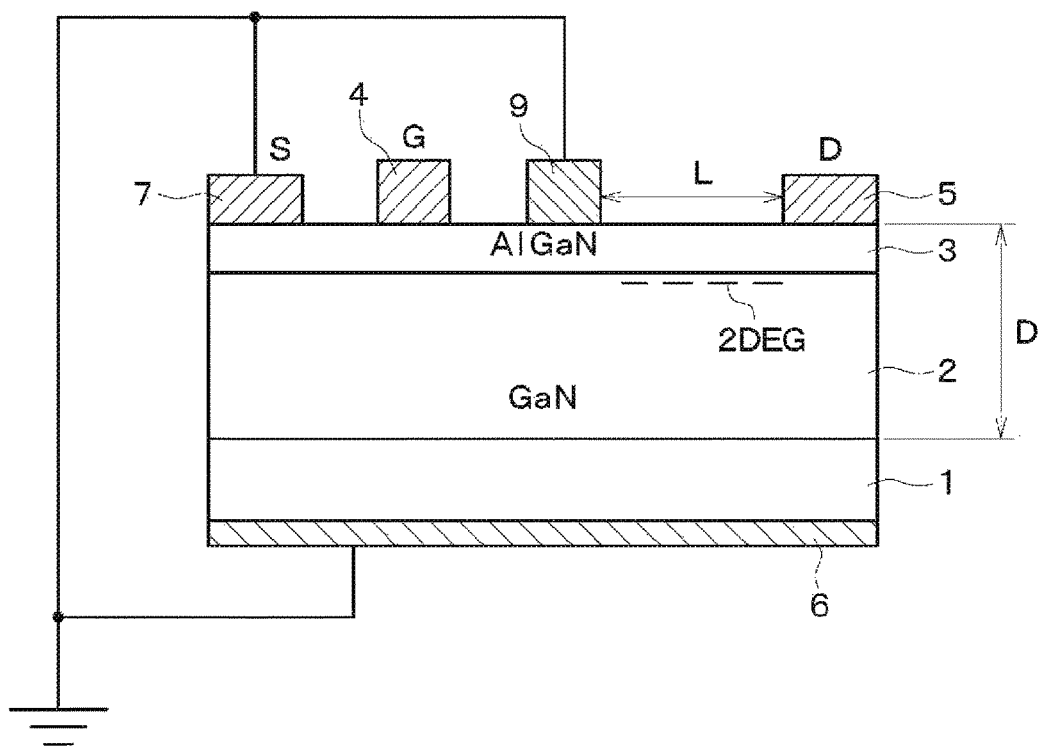
FIG. 19 is a cross-sectional view of a semiconductor device according to a fifth embodiment of the present disclosure.

In the present embodiment, as shown in FIG. 19, the fourth electrode 9 is in contact with the surface of the AlGaN layer 3 and the electrical field easing layer 8, which is included in the fourth embodiment, is not formed. The fourth electrode 9 includes a Schottky electrode that is in Schottky-contact with the AlGaN layer 3.

As described above, the fourth electrode 9 providing the fourth terminal may be provided by the Schottky electrode. Also in the present embodiment, the fourth electrode 9 has the source electrical potential. Even when the high electrical potential is applied to the second electrode 5 in the turning-off, the high electrical potential is applied to the fourth terminal. That is, the high electrical potential is restricted from being applied to the first electrode 4 providing the gate electrode and the gate can be protected from the high electrical potential. Accordingly, the semiconductor device having high voltage resistance and improved endurance is obtained.

Although the first electrode 4, which provides the gate electrode, is included in the gate electrode structure provided by the Schottky electrode structure in which the first electrode 4 includes the Schottky electrode that is in contact with the surface of the AlGaN layer 3 in FIG. 14, the gate electrode structure may be provided by other structures.

For example, similarly to FIG. 10, the gate electrode may be provided by the MOS structure in which the first electrode 4 is disposed on the AlGaN layer 3 through the gate insulation film 12. Similarly to FIG. 11, the first electrode 4, which provides the gate electrode, may be disposed on the gate GaN layer 13 formed of the GaN-type semiconductor layer such as the p-type GaN layer or the p-type AlGaN layer. Similarly to FIG. 16, the charge adjusting layer 10 may be formed between the fourth electrode 9 and the second electrode 5.

Other Embodiments

For example, in the above embodiments, the first and second GaN-type semiconductor layer providing the channel forming layer is provided by the GaN layer 2 and the AlGaN layer 3. However, the present disclosure is not limited to the embodiments. The other material may be employed as far as the channel forming layer is formed of the first GaN-type semiconductor layer and the second GaN-type semiconductor layer having a bandgap energy greater than the first GaN-type semiconductor layer.

In the above embodiments, the horizontal HEMI is described as an example of the device using the drift region of the channel forming layer. However, the present disclosure may be applied to the other device, e.g., a horizontal diode.

In the above embodiments, the semiconductor device is described in which one hetero-junction structure is provided by one first GaN-type layer and one second GaN-type layer. However, the present disclosure may be applied to a semiconductor device in which multiple layers of the channel forming layers are provided by multiple layers of the first and second GaN-type layers alternately repeated.

Although the present disclosure is described based on the above embodiments, the present disclosure is not limited to the embodiments and the structures. Various changes and modification may be made in the present disclosure. Furthermore, various combination and formation, and other combination and formation including one, more than one or less than one element may be made in the present disclosure.

The invention claimed is:

1. A semiconductor device comprising:
  a rear electrode that is grounded;
  a conductive substrate that is disposed on a surface of the rear electrode and that has a ground potential;
  a channel forming layer that is located above the conductive substrate and includes at least one hetero-junction structure, the hetero-junction structure including a first GaN-type semiconductor layer providing a drift region and a second GaN-type semiconductor layer having a bandgap energy greater than the first GaN-type semiconductor layer;
  a first electrode that is in contact with the second GaN-type semiconductor layer;
  a second electrode that is in contact with the second GaN-type semiconductor layer and is located separately from the first electrode;
  a third electrode that is in contact with the second GaN-type layer;
  an electrical field easing layer that is formed of a GaN-type semiconductor layer and is located between the first electrode and the second electrode above the second GaN-type semiconductor layer; and
  a fourth electrode that is located above the electrical field easing layer, wherein
  the first electrode, the second electrode, the third electrode, and the fourth electrode provide four terminals,
  the first electrode corresponds to a gate electrode, the second electrode corresponds to a drain electrode, and the third electrode corresponds to a source electrode,
  the third electrode, the fourth electrode, and the rear electrode have the ground potential,
  a distance between the first electrode and the second electrode is greater than a thickness of the hetero-junction structure including the first GaN-type semiconductor layer and the second GaN-type semiconductor layer,
  a distance between the fourth electrode and the second electrode is greater than the thickness of the hetero-junction structure, the channel forming layer is configured to generate a current by a carrier of a 2-dimensional electron gas, the 2-dimensional electron gas being generated by a polarization in the first GaN-type semiconductor layer adjacent to an interface between the first GaN-type semiconductor layer and the second GaN-type semiconductor layer, a total fixed charge quantity of charges in the first GaN-type layer and the second GaN-type layer is from $0.5 \times 10^{13}$ to $1.5 \times 10^{13}$ cm$^{-2}$, and the charges in the first GaN-type layer and the second GaN-type layer include charges generated by the polarization in the first GaN-type layer.

2. The semiconductor device according to claim 1, further comprising the fourth electrode that is located between the first electrode and the second electrode above the second GaN-type semiconductor layer, wherein the fourth electrode includes a Schottky electrode that has an electrical potential equivalent to the third electrode, and the first electrode, the second electrode, the third electrode and the fourth electrode provide four terminals.

3. The semiconductor device according to claim 1, wherein the electrical field easing layer is formed of an i-type GaN layer or a p-type GaN layer.

4. The semiconductor device according to claim 3, wherein the electrical field easing layer has a protruding portion protruding toward the second electrode from an end of the fourth electrode closest to the second electrode, and the protruding portion has a length equal to or less than a half of a distance between the fourth electrode and the second electrode.

5. The semiconductor device according to claim 1, wherein the gate electrode is included in a gate electrode structure provided by a Schottky electrode structure in which the first electrode, which provides the gate electrode, includes a Schottky electrode that is in contact with the second GaN-type semiconductor layer.

6. The semiconductor device according to claim 1, further comprising a gate insulation film that is located above the second GaN-type semiconductor layer, wherein the gate electrode is included in a gate electrode structure provided by a MOS structure in which the first electrode, which provides the gate electrode, is disposed on the second GaN-type semiconductor layer through the gate insulation film.

7. The semiconductor device according to claim 1, further comprising a gate GaN layer that is formed of a GaN-type semiconductor and is located above the second GaN-type semiconductor layer, wherein the gate electrode is included in a gate electrode structure provided by a structure in which the first electrode, which provides the gate electrode, is disposed on the second GaN-type semiconductor layer through the gate GaN layer.

8. The semiconductor device according to claim 1, further comprising a charge adjusting layer that is located above the second GaN-type semiconductor layer and is configured to increase the total fixed charge quantity in the drift region.

9. The semiconductor device according to claim 8, wherein the charge adjusting layer is formed of an n-type AlGaN layer or an n-type GaN layer, and the charge adjusting layer is configured to generate fixed charges by n-doping.

10. The semiconductor device according to claim 1, wherein the total fixed charge quantity corresponds to a total number of charges included in the first GaN-type semiconductor layer and the second GaN-type semiconductor layer.

11. The semiconductor device according to claim 1, wherein the total fixed charge quantity, which is from $0.5 \times 10^{13}$ to $1.5 \times 10^{13}$ cm$^{-2}$, depends on a concentration of the 2-dimensional electron gas, and the concentration of the 2-dimensional electron gas depends on an Al mixed crystal ratio and a thickness of the second GaN-type semiconductor layer.

12. The semiconductor device according to claim 1, wherein the first electrode is disposed on the second GaN-type semiconductor layer through an insulating film; and a surface of the second GaN-type semiconductor layer is partially recessed to provide a recess at a position where the first electrode is formed.

13. The semiconductor device according to claim 1, wherein a length of the electrical field easing layer from the fourth electrode to an edge of the electrical field easing layer in a direction toward the second electrode is equal to, or less than, one half of the distance between the fourth electrode and the second electrode.

* * * * *